United States Patent
Mos et al.

(10) Patent No.: US 8,706,442 B2
(45) Date of Patent: Apr. 22, 2014

(54) ALIGNMENT SYSTEM, LITHOGRAPHIC SYSTEM AND METHOD

(75) Inventors: Everhardus Cornelis Mos, Best (NL); Henricus Johannes Lambertus Megens, Waalre (NL); Maurits Van Der Schaar, Eindhoven (NL); Hubertus Johannes Gertrudus Simons, Venlo (NL); Scott Anderson Middlebrooks, Duizel (NL)

(73) Assignee: ASML Netherlands B.V., Veldhoven (NL)

( * ) Notice: Subject to any disclaimer, the term of this patent is extended or adjusted under 35 U.S.C. 154(b) by 305 days.

(21) Appl. No.: 13/000,443

(22) PCT Filed: Jul. 3, 2009

(86) PCT No.: PCT/EP2009/058404
§ 371 (c)(1),
(2), (4) Date: Apr. 28, 2011

(87) PCT Pub. No.: WO2010/006935
PCT Pub. Date: Jan. 21, 2010

(65) Prior Publication Data
US 2011/0196646 A1 Aug. 11, 2011

Related U.S. Application Data

(60) Provisional application No. 61/080,383, filed on Jul. 14, 2008.

(51) Int. Cl.
*G06F 15/00* (2006.01)
*G03B 27/54* (2006.01)

(52) U.S. Cl.
USPC ............................ 702/150; 356/389; 356/401

(58) Field of Classification Search
CPC ................. G06F 15/00; G03B 27/54
USPC .............. 702/94, 95, 150, 155, 172; 356/456, 356/458, 485, 486, 488, 490, 492, 496, 499, 356/124.5, 616, 620, 622, 628, 629, 391, 356/389, 92, 393, 395, 396–398, 401
See application file for complete search history.

(56) References Cited

U.S. PATENT DOCUMENTS

2002/0042664 A1 4/2002 Kikuchi
2006/0068301 A1* 3/2006 Hirukawa .................... 430/5
(Continued)

FOREIGN PATENT DOCUMENTS

EP 1 744 217 A1 1/2007
WO WO 98/39689 A1 9/1998

OTHER PUBLICATIONS

León, M.D.P., et al., "Full-wafer mapping and response surface modeling techniques for thin film deposition processes," Journal of Crystal Growth, vol. 311, No. 13, Jun. 2009; pp. 3399-3408.
International Search Report directed to related International Patent Application No. PCT/EP2009/058404, mailed Jan. 12, 2010; 5 pages.
(Continued)

*Primary Examiner* — John E Breene
*Assistant Examiner* — Ruihua Zhang
(74) *Attorney, Agent, or Firm* — Sterne, Kessler, Goldstein & Fox P.L.L.C.

(57) ABSTRACT

A lithographic system includes a lithographic apparatus comprising a projection system which projects a patterned radiation beam onto a target portion of a substrate and an alignment system which measures the position of a feature of the pattern on the substrate at a number of locations over the substrate. A controller compares the measured positions with points on a grid of values and extrapolates values for intermediate positions on the substrate based on values of corresponding intermediate points on the grid, so as to provide an indication of the intermediate positions on the substrate and their displacements relative to the grid. The grid is based on at least one orthogonal basis function, the measurement on the substrate being performed at positions corresponding to the root values of the at least one orthogonal basis function.

20 Claims, 9 Drawing Sheets

(56) References Cited

U.S. PATENT DOCUMENTS

2006/0166142 A1* 7/2006 Toyoda et al. ............... 430/311
2006/0227306 A1* 10/2006 Hirukawa et al. ............ 355/52
2006/0266243 A1* 11/2006 Percin et al. ................. 101/484
2007/0026325 A1* 2/2007 Maria Derksen et al. ..... 430/30
2008/0106714 A1* 5/2008 Okita ............................ 355/53

OTHER PUBLICATIONS

International Preliminary Report on Patentability and Written Opinion of the International Searching Authority directed to related International Patent Application No. PCT/EP2009/058404, issued Jan. 18, 2011; 6 pages.

* cited by examiner

ALIGNMENT SYSTEM, LITHOGRAPHIC SYSTEM AND METHOD

CROSS-REFERENCE TO RELATED APPLICATIONS

This application claims the benefit of U.S. provisional application 61/080,383 which was fled on 14 Jul. 2008, and which is incorporated herein in its entirety by reference.

FIELD OF THE INVENTION

The present invention relates to an alignment system having particular, although not exclusive, use in a lithographic system and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to allow for a number of patterned layers to be positioned on the substrate, it is desirable to accurately set the position of the substrate relative to the radiation beam and the patterning device. This may be performed by accurately positioning the substrate on a substrate table and positioning the substrate table relative to the radiation beam and the patterning device.

Alignment of a substrate may be performed by an alignment system. For example, a number of alignment marks on the substrate are measured to derive a co-ordinate system, which is compared to a modeled grid to derive the positions of features on the substrate. However, clamping of the substrate on the substrate table, or wafer distortion occurring in non-lithography process steps, may cause distortion of the substrate, which can be monitored by comparison of the measurements to the grid. Models describing the wafer grid may be created, which are used in exposing wafers so as to compensate for the distortions.

Measurements of the overlay, which is the alignment of successive layers formed on the substrate, may also be made using a modeled grid. The modeled grid can be used to describe the overlay error over the substrate with respect to the previous layer, and may be produced and used in a control loop to ensure lot-to-lot consistency. It has been found that overlay can be improved by using a non-linear grid instead of a linear grid within the model. However, small changes in the shape of a non-linear grid can have dramatic effects on the individual comparisons of the measurements and the model. Thus monitoring of the individual fit parameters is meaningless and "run-to-run" control rules, such as parameter damping are not helpful.

SUMMARY

Therefore, what is needed is a grid that may have more accurate predictable characteristics for alignment of successive layers than known grids.

In an embodiment of the present invention, there is provided a lithographic system comprising a lithographic apparatus configured to transfer a pattern from a patterning device onto a substrate, an alignment system comprising a measurement device configured to measure a position of a feature of the pattern on the substrate at a plurality of locations over the substrate, a controller configured to compare the position with points on a grid of values to determine the displacement of the position relative to points on the grid and extrapolate values for intermediate positions on the substrate based on values of corresponding intermediate points on the grid, so as to provide an indication of the intermediate positions on the substrate and their displacements relative to the grid, wherein the grid is based on at least one orthogonal basis function and the measurement is performed at the position corresponding to roots of the at least one orthogonal basis function.

In another embodiment of the present invention, there is provided an alignment system comprising a measurement device configured to measure a position of a feature of a pattern on a substrate and a controller configured to compare the position with points on a grid of values to determine a displacement of the position relative to the points on the grid and extrapolate values for intermediate positions on the substrate based on values of intermediate points on the grid, so as to provide an indication of the intermediate positions on the substrate and their displacements relative to the grid, wherein the grid is based on at least one orthogonal basis function and the measurement is performed at a position corresponding to the roots of the at least one basis function.

In a further embodiment of the present invention, there is provided a device manufacturing method comprising transferring a pattern from a patterning device onto a substrate, measuring the position of a feature of the pattern on the substrate, comparing the position with points on a calculated grid of values and determining a displacement of the positions relative to the points on the grid, extrapolating values for intermediate positions on the substrate based on values of intermediate points on the grid, so as to provide an indication of the intermediate positions on the substrate and their displacements relative to the grid,
wherein the grid is based on at least one orthogonal basis function and the measurement are performed at the position corresponding to roots of the at least one orthogonal basis function.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which.

One or more embodiments of the present invention will now be described with reference to the accompanying drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Figure 1:
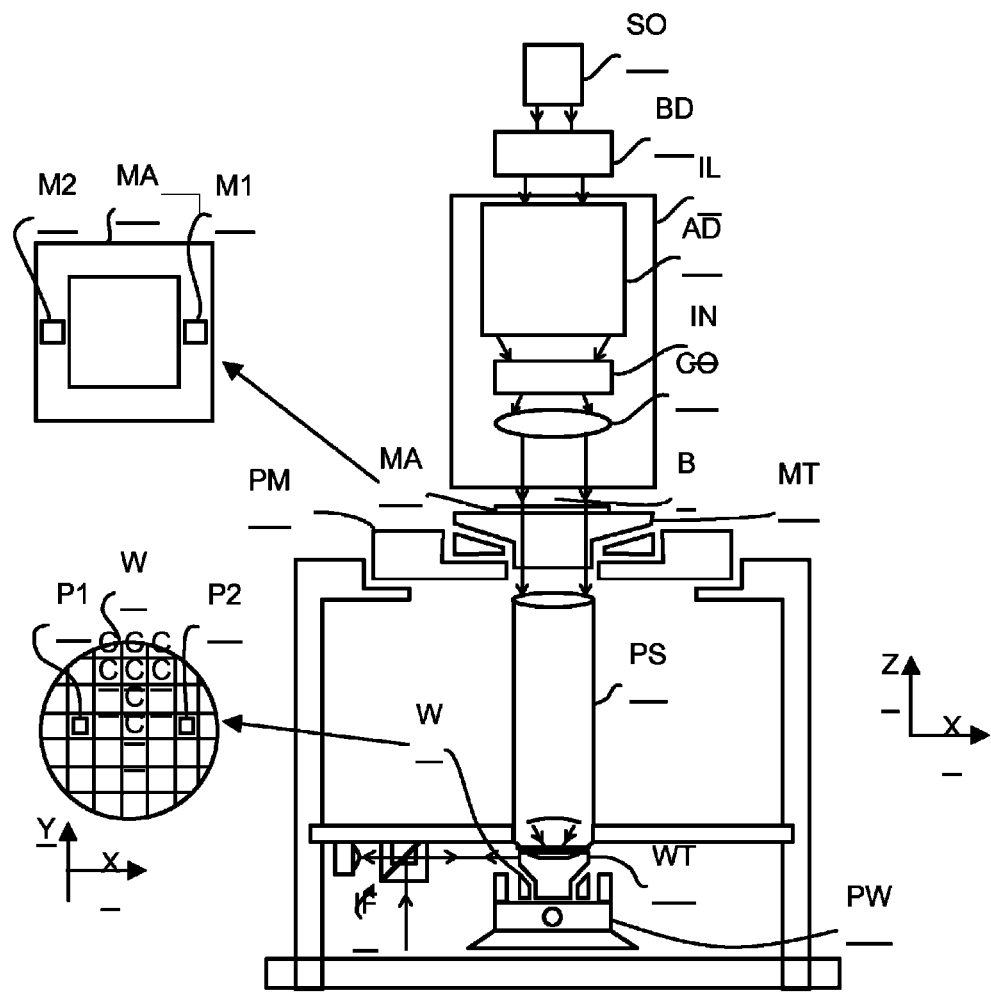
FIG. 1 depicts a lithographic apparatus according to an embodiment of the invention.

FIG. 1 schematically depicts a lithographic apparatus according to one embodiment of the invention. The apparatus comprises an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic, or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example, when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2, and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies. Alignment of a substrate may also be performed, for example, by an alignment system as described in International Application No. PCT/IB1998/000261 (Publication No. WO 98/39689), the contents of which are incorporated in their entirety herein by reference.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
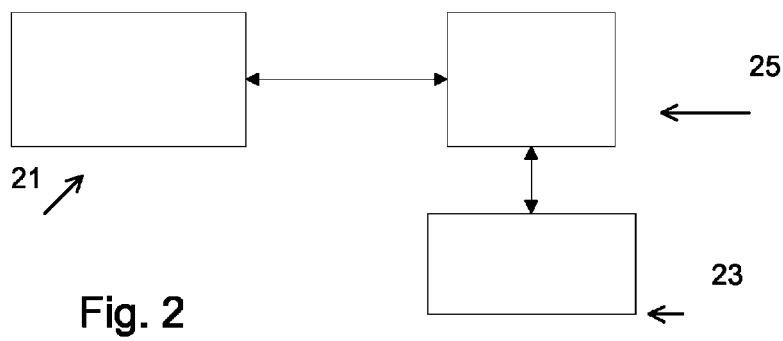
FIG. 2 depicts a lithographic system incorporating the lithographic apparatus of FIG. 1.

Referring now also to FIG. 2, in one embodiment of the invention, a lithographic apparatus 21, such as that illustrated in FIG. 1, may form part of a lithographic system comprising the lithographic apparatus 21, an alignment measurement system 23 arranged to measure parameters of the pattern deposited on the wafer W during the lithographic process and a processor 25 arranged to control the alignment measurement system 25, which may also provide suitable control signals to control the position of the substrate table relative to the radiation beam and/or the patterning device. The alignment measurement system in particular is arranged to measure parameters such as overlay or alignment, the data being analyzed in processor 25.

Figure 3:
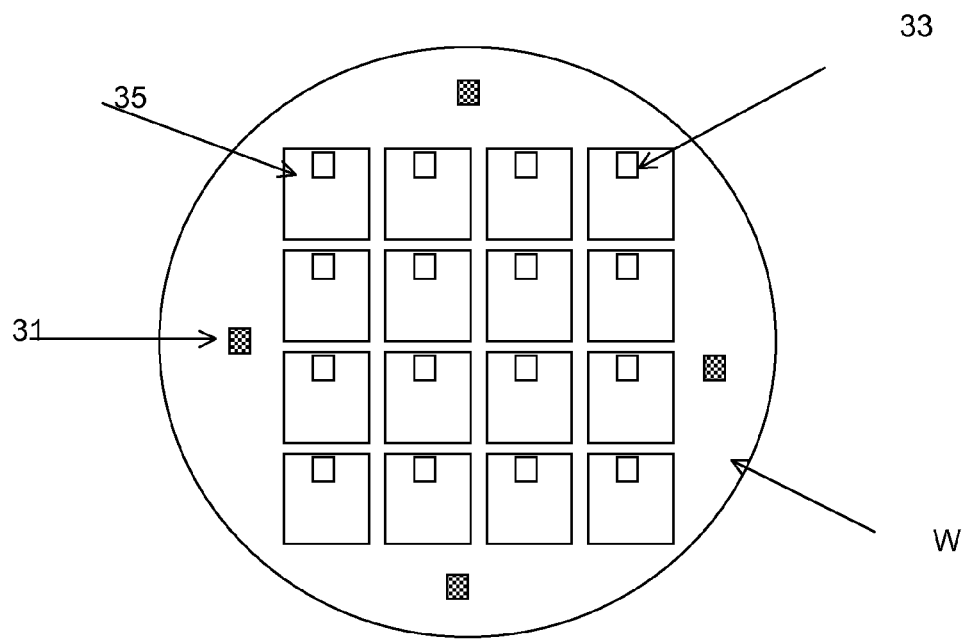
FIG. 3 depicts the alignment marks on a substrate being measured by the alignment system depicted in FIG. 2.

FIG. 3 is an example of the wafer alignment process and overlay measurement, which may take place in the alignment measurement system of FIG. 2. The positions of four alignment marks 31 on the wafer W are measured. The measurement may take place, for example, using ATHENA™ Phase-Grating Alignment System produced by ASML Netherlands B.V. of The Netherlands in which dual-wavelength radiation is directed onto alignment marks in the form of diffraction gratings, as described in detail in International Publication No. WO 98/39689 referred to above. Alternative measurement techniques may include scanning electron microscopy. In this particular embodiment, overlay is also measured using the overlay targets 33 positioned in each exposure location 35 on the wafer W.

Figure 4:
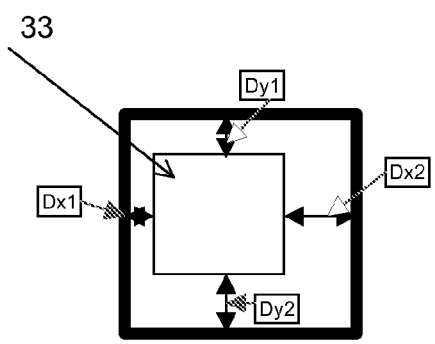
FIG. 4 depicts a detail of a measurement of the overlay error in FIG. 3.

As indicated in FIG. 4, two dimensional, that is an X and Y direction, overlay error can be measured to calculate where the wafer stage has to move to expose a second layer on top of an already exposed first layer. In the X direction, the overlay is given by (Dx2−Dx1)/2, while in the Y direction the overlay error is given by (Dy2−Dy1)/2. It will be appreciated that different wafer models will lead to different exposure locations based on the same alignment mark location.

In accordance with an embodiment of the invention, the alignment and/or overlay are measured at a plurality of points over the wafer W as described above, a combination of two orthogonal basis functions being used to calculate a grid, the grid then enabling values for intermediate points to be calculated. Each of the basis functions is chosen to be a polynomial, which is orthogonal over a chosen interval, and to be such that the coefficients of the polynomial can be completely determined by sampling at the roots, that is the zeros of the polynomials.

The measurements on the wafer may also be based on different co-ordinate systems such as the rotation of the X axis about the Z axis (Rzx) and/or the rotation of the Y axis about the Z axis (Rzy). Magnification of the image on the substrate relative to the pattern on the mask may also be measured. An intra-field alignment scheme may be used in which a die on a previous layer formed on the substrate is measured with respect to the chosen coordinate scheme.

The choice of basis function or functions will be influenced by the form of the wafer. For example, where the translations Tx and Ty of the alignment are to be measured over the circular wafer, with these translations denoted in polar co-ordinates (r,θ), basis functions, which are orthogonal over the intervals r=[0 1] and θ=[0 2π] with a periodicity of 2π are suitable choices. In this particular example, a combination of Chebyshev polynomials for r=[0 1] and a Fourier series for θ=[0 2π] is appropriate. These functions are shown in FIG. 5 (Chebyshev polynomial) and FIG. 6 (Fourier series).

Figure 5:
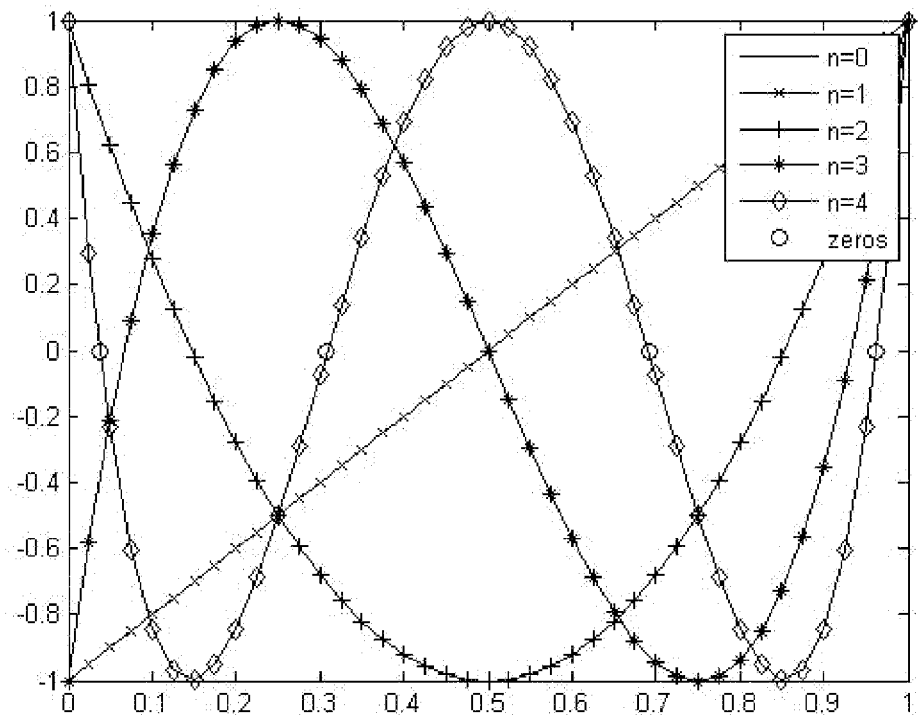
FIG. 5 depicts a Chebyshev polynomial.

As can be seen from FIG. 5, for the various orders of Chebyshev polynomial (n=0, 1, 2, 3, 4) the polynomials are orthogonal over the interval [0 1] with extrema at 1 and −1. The polynomials are entirely predictable from a small number of points, with the coefficients totally determinable by sampling at the positions corresponding to the zeros of the polynomials.

Figure 6:
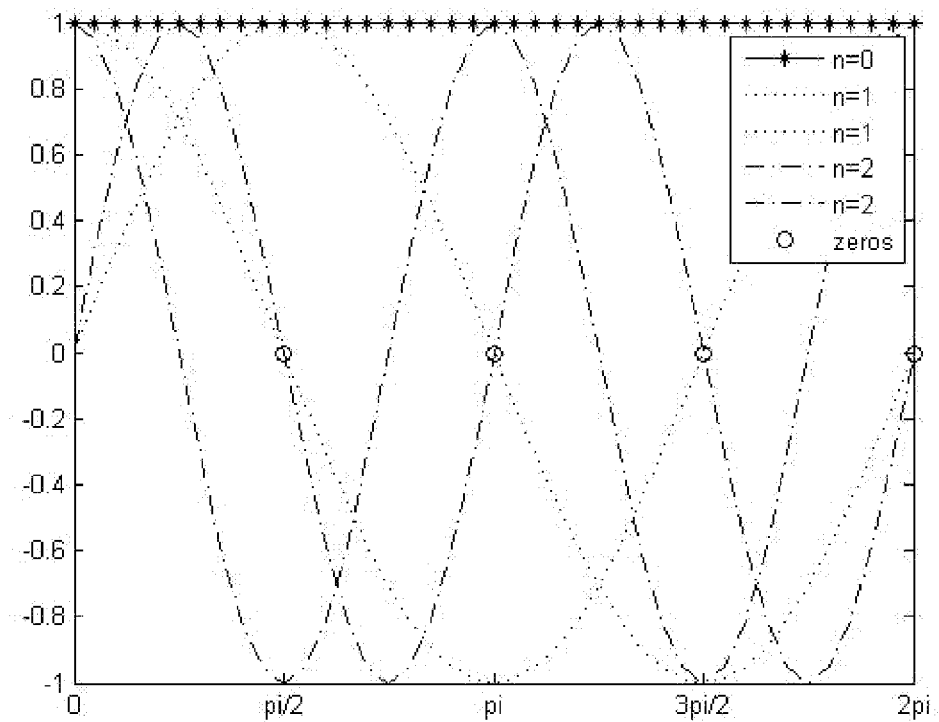
FIG. 6 depicts a Fourier series function.

The Fourier series shown in FIG. 6 show the orders n=0, 1, 1, 2, 2, at which the series is orthogonal over [0, 2π] with extrema at 1 and −1.

Figure 7:
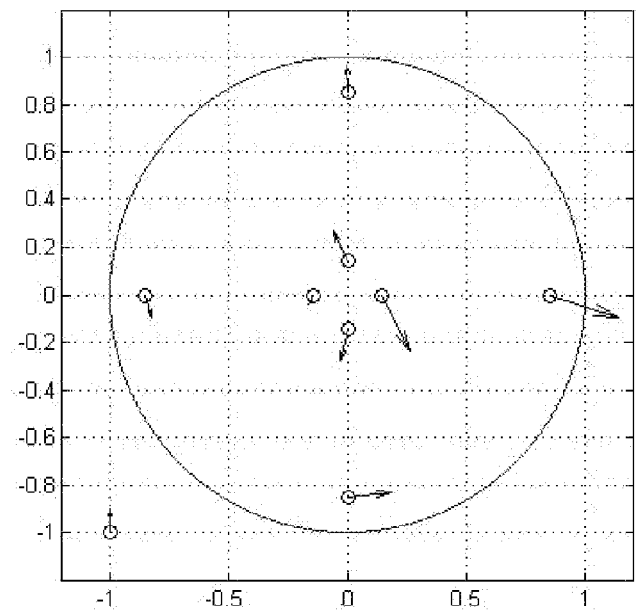
FIG. 7 depicts a number of measurement points overlaid on a grid system incorporating a second order Chebyshev polynomial and a second order Fourier series.

FIG. 7 illustrates eight measurement points shown as circles on the wafer W mapped onto a grid produced as translation Tx and Ty co-ordinates, the misalignment vectors, which is the difference between the measured value and the value of the original pattern before projection being shown as arrows. The circled points correspond to the zeros of the basis functions as indicated as circles in FIGS. 5 and 6.

It will be appreciated that for clarity only the Tx and Ty mappings are shown, with no rotation or magnification measurements.

Figure 8:
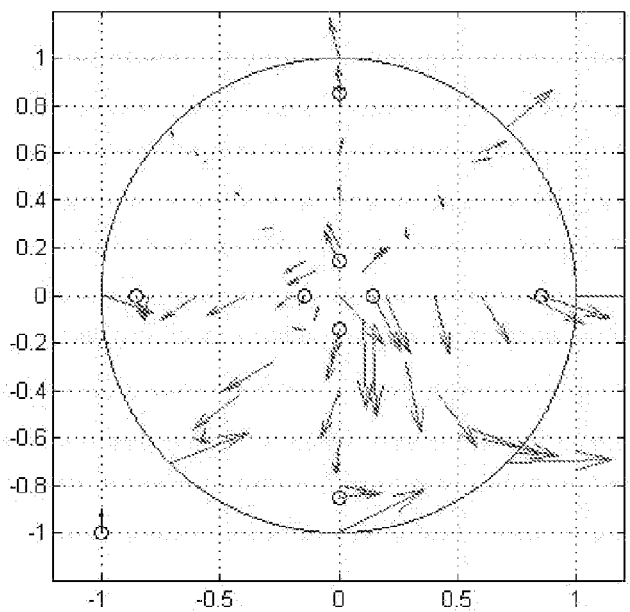
FIG. 8 depicts translations in the X and Y directions across the whole wafer for the grid shown in FIG. 7.

Referring to FIG. 8, this figure illustrates the corresponding misalignment output vectors for points across the wafer, which is calculated by the processor 25 from the grid. The output vectors are completely determined by the measurements at the zeros of the basis functions.

The values of the position or overlay found from the grid can be expressed in a series of equations:

$$Xk+1=AXk+BUk$$

$$Yk=CXk$$

where:
Xk, Xk+1 are the translation vectors at each point k, k+1 as shown in FIG. 8;
Yk are the output values, that are the vectors shown as dotted arrows in FIG. 8;
AXk+BUk represent the linear combination of the two chosen basis functions; and
C is built from the orthogonal basis functions, which is the second order Fourier series and the second order Chebyshev polynomial, in this particular example together with measurement coordinates at positions corresponding to the zeros of the functions.

Because of the choice of orthogonal basis functions and sampling at the zeros of the functions, C will be well conditioned, which is non-singular.

Figure 9:
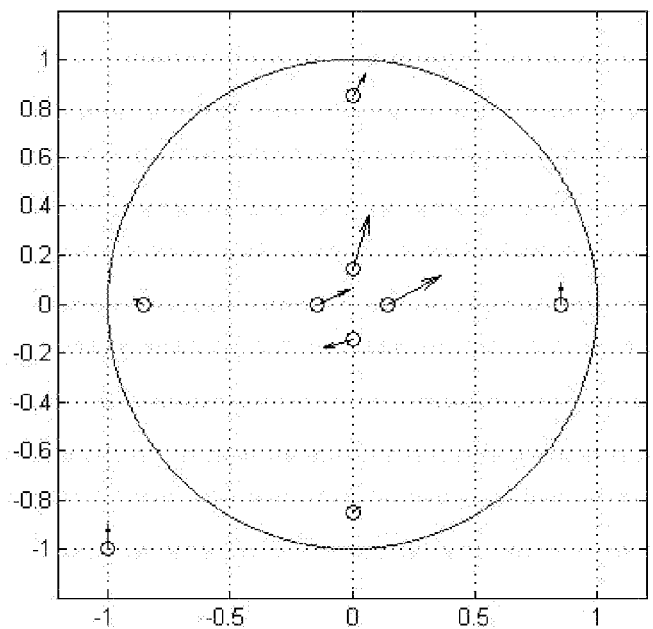
FIG. 9 depicts the measurement points for a grid using a different second order Chebyshev polynomial and second order Fourier series function.
Figure 10:
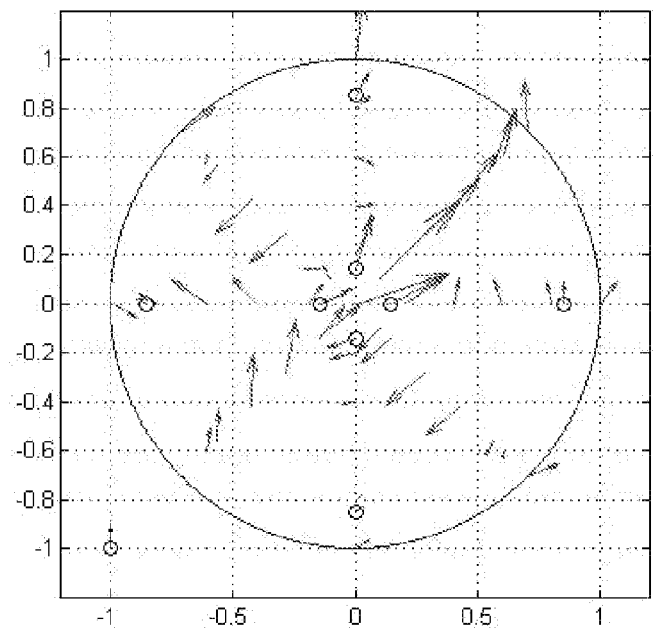
FIG. 10 illustrates the displacement across the entire wafer using the grid of FIG. 9.
Figure 11:
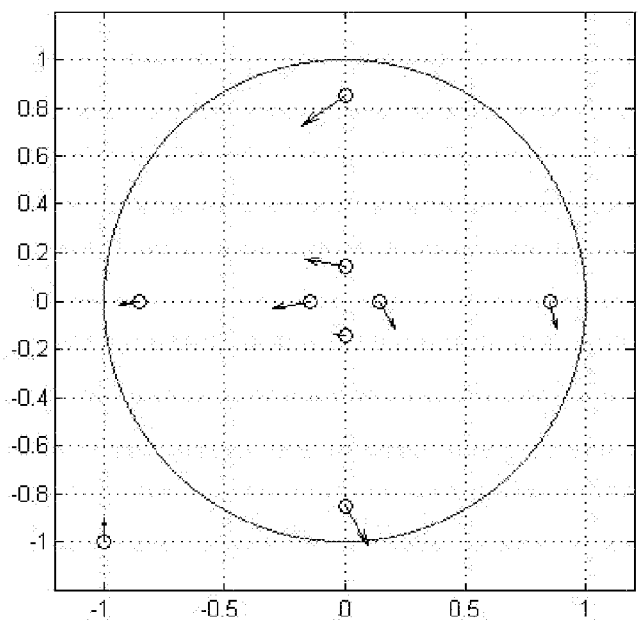
FIG. 11 shows a further different second order Chebyshev polynomial and second order Fourier series grid.
Figure 12:
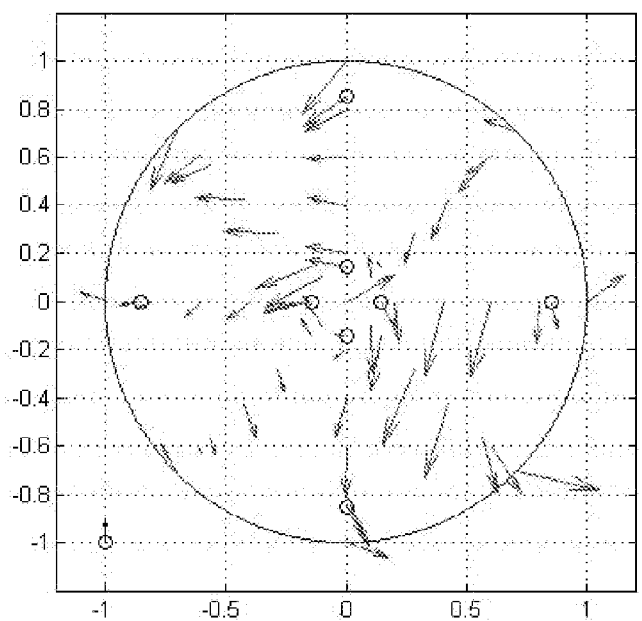
FIG. 12 shows the output across the wafer using the grid of FIG. 11.
Figure 13:
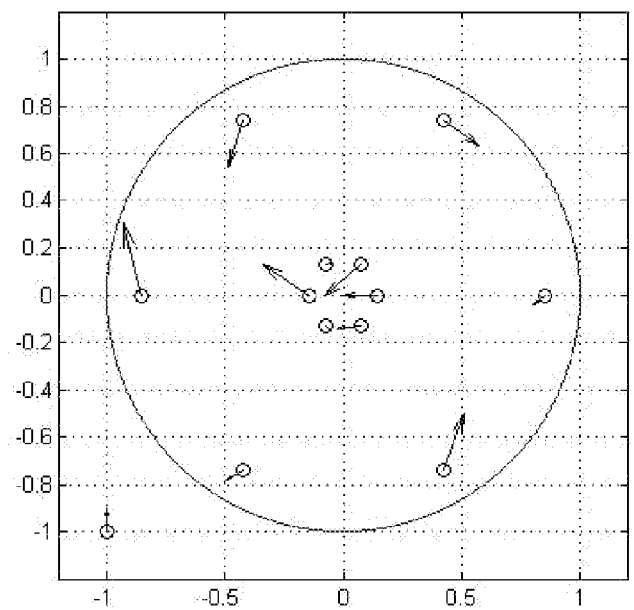
FIG. 13 shows the measurement points across the wafer using a grid comprising second order Chebyshev polynomial and third order Fourier series.
Figure 14:
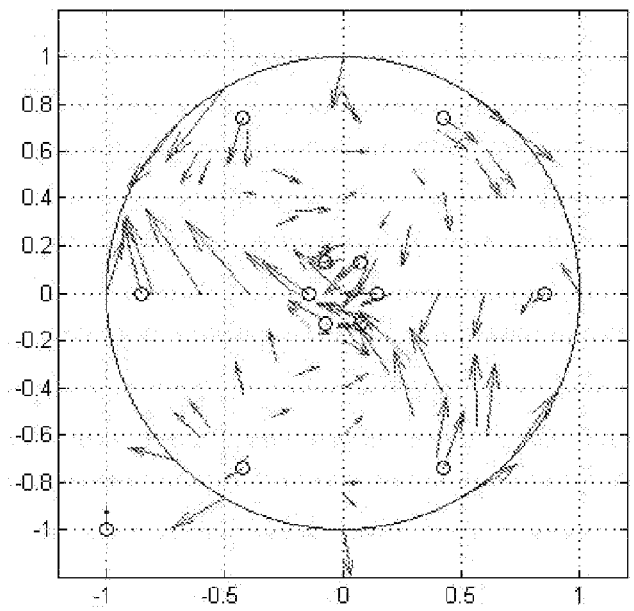
FIG. 14 shows the output across the wafer using the grid of FIG. 13.

As can be seen in relation to FIGS. 7 and 8, for the second order Chebyshev polynomial and second order Fourier series in this particular example, fifteen states map each of Tx and Ty to the misalignment X and Y vectors. It will be appreciated that various orthogonal functions can be used as examples of which are shown in FIGS. 9 and 10, FIGS. 11 and 12, and FIGS. 13 and 14. FIGS. 9 and 10, 11 and 12 show further examples of orthogonal functions formed from second order Chebyshev polynomials and second order Fourier series. FIGS. 9 and 11 show the measurement points at the zeroes of the functions while FIGS. 10 and 12 show the calculated output vectors Y across the wafer. In each case it is only necessary to have eight measurement points on the wafer corresponding to the zeros of the functions. By contrast, FIGS. 13 and 14 illustrate the grid for a second order Chebyshev polynomial and a third order Fourier series. In this case it is necessary to have twelve measurement points on the wafer corresponding to the zeros of these functions as indicated in FIG. 13, with a corresponding complexity of processing to produce the output Y vectors, as shown in FIG. 14. It will be appreciated that in general the process will be a compromise between accuracy and the time taken to obtain the measurements used for the processing, together with the time taken for the processing itself.

Figure 15:
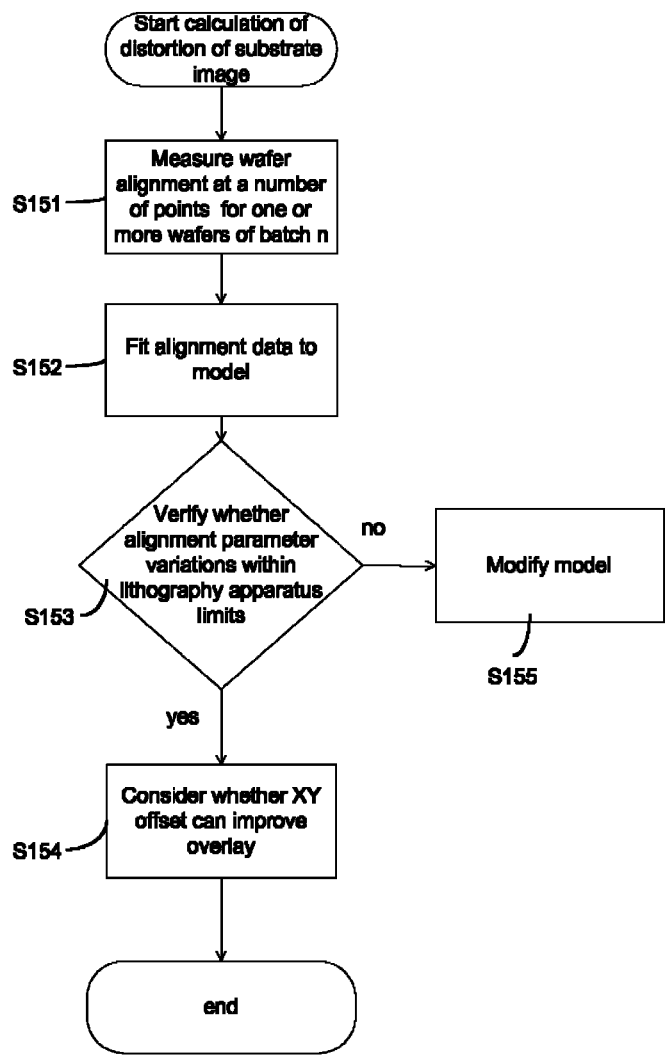
FIG. 15 depicts a flow diagram of the derivation of a model to be used in a lithographic process.

FIG. 15 illustrates the use of the alignment and overlay measurement technique in the calculation of the distortion of a substrate image on a batch of wafers produced in a lithography process performed by a lithographic apparatus, such as the apparatus shown in FIG. 1.

Figure 16:
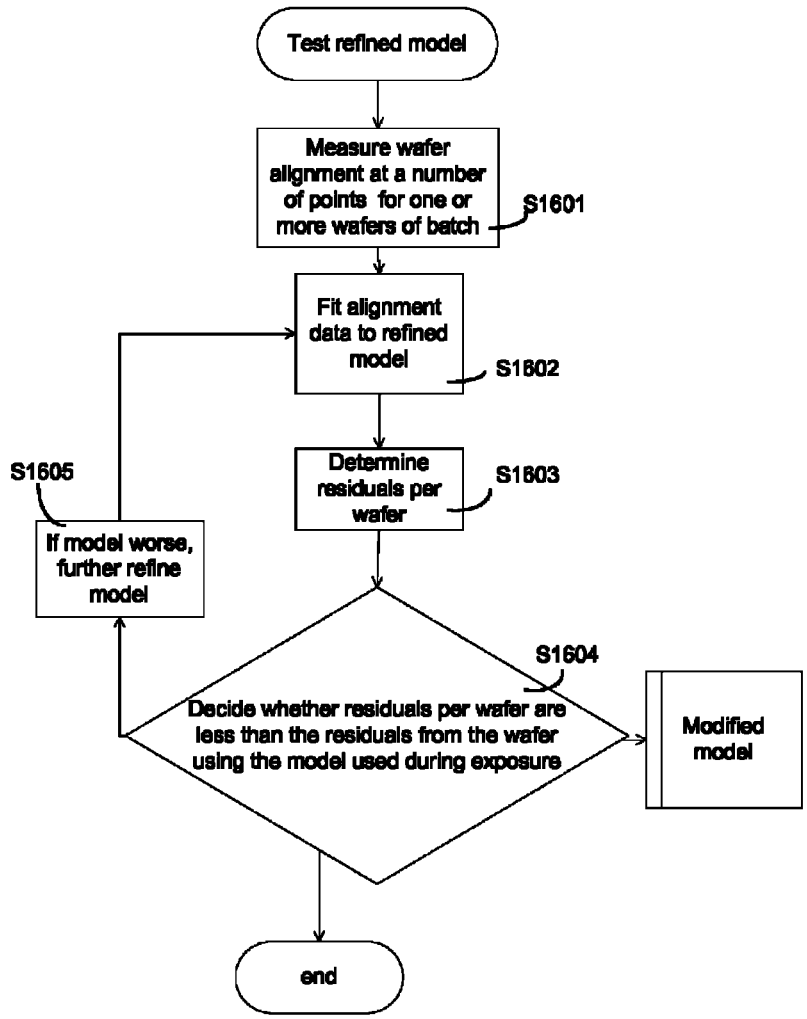
FIG. 16 depicts the testing of a model derived in the process depicted in FIG. 15.

In step S151, the alignment of features on the wafer is measured at a number of points for one or more wafers in a batch. Using the wafer alignment marks 31 shown in FIG. 3, it is determined whether the alignment parameter variations from wafer to wafer are within the limits tolerable in the lithographic process in step S153. If the wafer to wafer variation is determined in step S153 to be tolerable, it is verified whether application of XY offset per exposure can improve overlay errors in the lithographic process in step S154 and suitable XY offset is applied to the wafer stage during subsequent processing in the lithographic apparatus. Alternatively, if the residuals across the wafers are determined not to be tolerable in step S155, the model is modified using the process, which will now be described with reference to FIG. 16.

Where it is decided that it is necessary to refine the model, different orthogonal basis functions or combinations of orthogonal basis functions may be used, together with different parameter values. Such a refined model may be tested using the process set out in FIG. 16.

In step S1601, the wafer alignment or overlay is measured for one or more wafers of a particular batch or series of batches. The number of measurement points being dependent on the particular basis functions and being at positions on the wafer corresponding to the zeros of the basis function. The alignment data is then fitted to the refined model in step S1602 and the number of residuals per wafer determined in step S1603.

In step S1604, it is decided whether the residual per wafer are less than the residuals from the wafer using the model, which has been used during the exposure before refinement of the model. If the modified model produces less residuals per wafer, the modified model is stored and used in further processing. Otherwise, the model is further refined in step S1605 with steps S1602, S1603, and S1604 repeated until an improved model is produced.

Overlay measurements may be made using a metrology technique such as performed by the ASML Yieldstar™ apparatus. By fitting different grid models to the available alignment data and using the results to correct the available metrology data, it can be determined whether an alternative model will result in less overlay errors.

It will be appreciated that due to the nature of the grid, the resultant fitted parameters can be stored and monitored with changes of individual parameters being tested against control limits. Damping rules can be applied to the stored parameters in order to filter subsequent measurement noise or other control algorithms such as model predictive control (MPC) may be used. Such an arrangement simplifies control of the parameters to a series of relatively fast robust calculations.

It will be appreciated that the parameters derived for the model may be used in a lithographic run controller to correct for a non-linear grid during alignment or exposure of a wafer.

It will be appreciated that while in the embodiment described here by way of example, a combination of Chebyshev polynomials and Fourier series orthogonal basis functions have been used, one single orthogonal basis function or a combination of any suitable orthogonal basis function may be used. Examples of suitable basis functions include Zernike functions, Gegenbauer polynomials, Hermite polynomials, Jacobi polynomials etc. It will be appreciated that this list is not exhaustive. The choice of the function or functions will depend on such factors as the shape of the wafer, a function such as a Fourier series being most appropriate for the 0 polar co-ordinate of a circular wafer, while other functions are more appropriate for other shaped wafers.

It will be appreciated that while the alignment method described here by way of example, has particular application in a lithography system, the alignment method will find use in other applications in which it is required to measure a position of a feature of a pattern over a substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic, and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic system comprising:
  a lithographic apparatus configured to transfer a pattern from a patterning device onto a substrate; and
  an alignment system comprising,
    a measurement device configured to measure a position of a feature of the pattern on the substrate at a plurality of locations over the substrate; and a controller configured to, compare the position with points on a grid of values to determine a displacement of the position relative to points on the grid; and extrapolate values for intermediate positions on the substrate based on values of corresponding intermediate points on the grid, so as to provide an indication of the intermediate positions on the substrate and their displacements relative to the grid, wherein the grid is based on at least one orthogonal basis function and the measurement is performed at the position corresponding to roots of the at least one orthogonal basis function, and wherein the at least one orthogonal basic function is configured to accommodate a shape of the substrate.

2. The lithographic system of claim 1, wherein the at least one orthogonal basis function is chosen from at least one of a Fourier series, a Zernike function, a Chebyshev polynomial, a Gegenbauer polynomial, a Jacobi polynomials, or a Hermite polynomial.

3. The lithographic system of claim 1, wherein the at least one orthogonal basis function is configured to accommodate measuring a plurality of the positions.

4. The lithographic system of claim 1, wherein there is a plurality of the at least one orthogonal basis function, and each one of the plurality of basis functions corresponds to a respective measurement dimension.

5. An alignment system, comprising:
a measurement device configured to measure a position of a feature of a pattern on a substrate; and
a controller configured to,
compare the position with points on a grid of values to determine a displacement of the position relative to the points on the grid; and
extrapolate values for intermediate positions on the substrate based on values of intermediate points on the grid, so as to provide an indication of the intermediate positions on the substrate and their displacements relative to the grid, wherein the grid is based on at least one orthogonal basis function and the measurement is performed at a position corresponding to the roots of the at least one orthogonal basis function, and wherein the at least one orthogonal basis function is configured to accommodate a shape of the substrate.

6. A device manufacturing method, comprising:
transferring a pattern from a patterning device onto a substrate;
measuring, using a measurement device, the position of a feature of the pattern on the substrate;
comparing, using a controller, the position with points on a calculated grid of values and determining a displacement of the position relative to the points on the grid; and
extrapolating, using the controller, values for intermediate positions on the substrate based on values of intermediate points on the grid, so as to provide an indication of the intermediate positions on the substrate and their displacements relative to the grid,
wherein the grid is based on at least one orthogonal basis function and the measurement is performed at the position corresponding to roots of the at least one orthogonal basis function, and wherein the at least one orthogonal basis function is configured to accommodate a shape of the substrate.

7. The device manufacturing method of claim 6, further comprising:
using the grid to produce a representation of the substrate; and
using the representation to adjust one or more lithographic parameters.

8. The device manufacturing method of claim 6 further comprising using the grid to produce a representation of an overlay across the substrate.

9. A method of measuring alignment, comprising:
measuring, using a measurement device, a position of a feature of a pattern on a substrate;
comparing, using a controller, the position with points on a grid of values to determine a displacement of the position relative to the point on the grid; and
extrapolating, using the controller, values for intermediate positions on the substrate based on values of intermediate points on the grid, so as to provide an indication of the intermediate positions on the substrate and their displacements relative to the grid,
wherein the grid is based on at least one orthogonal basis function and the measurement is performed at the position corresponding to roots of the at least one orthogonal basis function, and wherein the at least one orthogonal basis function is configured to accommodate a shape of the substrate.

10. A non-transitory computer-readable storage medium storing instructions, the instructions comprising:
instructions for transferring a pattern from a patterning device onto a substrate;
instructions for measuring the position of a feature of the pattern on the substrate;
instructions for comparing the position with points on a calculated grid of values and determining a displacement of the position relative to the points on the grid; and
instructions for extrapolating values for intermediate positions on the substrate based on values of intermediate points on the grid, so as to provide an indication of the intermediate positions on the substrate and their displacements relative to the grid,
wherein the grid is based on at least one orthogonal basis function and the measurement is performed at the position corresponding to roots of the at least one orthogonal basis function, and wherein the at least one orthogonal basis function is configured to accommodate a shape of the substrate.

11. A non-transitory computer-readable storage medium having computer program code recorded thereon that, when executed by a processor, causes the processor to perform operations comprising:
transferring a pattern from a patterning device onto a substrate;
measuring the position of a feature of the pattern on the substrate;
comparing the position with points on a calculated grid of values and determining a displacement of the position relative to the points on the grid; and
extrapolating values for intermediate positions on the substrate based on values of intermediate points on the grid, so as to provide an indication of the intermediate positions on the substrate and their displacements relative to the grid,
wherein the grid is based on at least one orthogonal basis function and the measurement is performed at the position corresponding to roots of the at least one orthogonal basis function, and wherein the at least one orthogonal basis function is configured to accommodate a shape of the substrate.

12. A lithographic system comprising:
a lithographic apparatus configured to transfer a pattern from a patterning device onto a substrate; and an alignment system comprising:
a measurement arrangement configured to measure the position of features of the pattern on the substrate at a plurality of positions over the substrate; and
a processor configured to:
compare said positions with points on a calculated grid of values to determine the displacement of the positions relative to points on the grid; and
extrapolate values for intermediate positions on the substrate based on values of intermediate points on the grid, so as to provide an indication of the intermediate positions on the substrate and their displacements relative to the grid;
wherein the grid is calculated on the basis of at least one orthogonal basis function and said measurements are performed at positions corresponding to the roots of the basis function, and wherein the at least one orthogonal basis function is configured to accommodate a shape of the substrate.

13. The lithographic system according to claim 12, wherein the basis function is chosen to take account of the number of measured positions.

14. The lithographic system according to claim 12, wherein there are a plurality of basis functions each corresponding to a respective measurement dimension.

15. An alignment system for measuring the alignment of a pattern formed on a substrate comprising:
a measurement arrangement configured to measure the position of features of the pattern on the substrate at a plurality of positions over the substrate; and
a processor configured to:
compare said positions with points on a calculated grid of values to determine the displacement of the positions relative to the points on the grid, and
extrapolate values for intermediate positions on the substrate based on values of intermediate points on the grid, so as to provide an indication of the intermediate positions on the substrate and their displacements relative to the grid,
wherein the grid is calculated on the basis of at least one orthogonal basis function and said measurements are performed at positions corresponding to the roots of the basis function, and wherein the at least one orthogonal basis function is configured to accommodate a shape of the substrate.

16. A device manufacturing method comprising:
transferring a pattern from a patterning device onto a substrate;
measuring, using a measurement device, the position of features of the pattern on the substrate at a plurality of positions over the substrate;
comparing, using a controller, said positions with points on a calculated grid of values and determining the displacements of the positions relative to the points on the grid; and
extrapolating, using the controller, values for intermediate positions on the substrate based on values of intermediate points on the grid, so as to provide an indication of the intermediate positions on the substrate and their displacements relative to the grid,
wherein the grid is calculated on the basis of at least one orthogonal basis function and said measurements are performed at positions corresponding to the roots of the basis function, and wherein the at least one orthogonal basis function is configured to accommodate a shape of the substrate.

17. The device manufacturing method according to claim 16, further comprising:
using said grid to produce a representation of the substrate; and
using said representation to adjust one or more lithographic parameters.

18. The device manufacturing method according to claim 16, further comprising:
using said grid to produce a representation of overlay across said substrate.

19. A method of measuring alignment comprising:
measuring, using a measurement device, the position of features of a pattern on a substrate at a plurality of positions over the substrate;
comparing, using a controller, said positions with points on a calculated grid of values to determine the displacement of the positions relative to points on the grid; and
extrapolating, using the controller, values for intermediate positions on the substrate based on values of intermediate points on the grid, so as to provide an indication of the intermediate positions on the substrate and their displacements relative to the grid;
wherein the grid is calculated on the basis of at least one orthogonal basis function and said measurements are performed at positions corresponding to the roots of the basis function, and wherein the at least one orthogonal basis function is configured to accommodate a shape of the substrate.

20. A computer program stored upon a non-transitory computer-readable storage medium, and comprising processor executable instructions for causing a processor to execute operations comprising:
transferring a pattern from a patterning device onto a substrate, measuring the position of features of the pattern on the substrate at a plurality of positions over the substrate; and
comparing said positions with points on a calculated grid of values and determining the displacements of the positions relative to the points on the grid;
extrapolating values for intermediate positions on the substrate based on values of intermediate points on the grid, so as to provide an indication of the intermediate positions on the substrate and their displacements relative to the grid,
wherein the grid is calculated on the basis of at least one orthogonal basis function and said measurements are performed at positions corresponding to the roots of the basis function, and wherein the at least one orthogonal basis function is configured to accommodate a shape of the substrate.

* * * * *

UNITED STATES PATENT AND TRADEMARK OFFICE
CERTIFICATE OF CORRECTION

| | | |
|---|---|---|
| PATENT NO. | : 8,706,442 B2 | Page 1 of 1 |
| APPLICATION NO. | : 13/000443 | |
| DATED | : April 22, 2014 | |
| INVENTOR(S) | : Mos et al. | |

It is certified that error appears in the above-identified patent and that said Letters Patent is hereby corrected as shown below:

In the Claims

In column 14, line 14, claim 1, please delete "basic" and insert --basis--

Signed and Sealed this
Sixteenth Day of September, 2014

Michelle K. Lee
*Deputy Director of the United States Patent and Trademark Office*